(12) United States Patent
Wenzel et al.

(10) Patent No.: US 7,834,466 B2
(45) Date of Patent: Nov. 16, 2010

(54) SEMICONDUCTOR DIE WITH DIE PAD PATTERN

(75) Inventors: Robert J. Wenzel, Austin, TX (US); Trung Q Duong, Austin, TX (US); Ilan Lidsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 42 days.

(21) Appl. No.: 11/957,838

(22) Filed: Dec. 17, 2007

(65) Prior Publication Data

US 2009/0152718 A1 Jun. 18, 2009

(51) Int. Cl.
*H01L 23/48* (2006.01)
*H01L 23/52* (2006.01)
*H01L 29/40* (2006.01)

(52) U.S. Cl. .................. 257/786; 257/779; 257/780; 257/E23.02

(58) Field of Classification Search .................. 257/734, 257/737, 738, 773, 786, 779, 780, E23.02
See application file for complete search history.

(56) References Cited

U.S. PATENT DOCUMENTS 4,254,445 A * 3/1981 Ho .............................. 361/728
4,843,191 A * 6/1989 Thomas .................... 174/88 R
5,784,262 A * 7/1998 Sherman ..................... 361/777

(Continued)

OTHER PUBLICATIONS

Audet, et al., "Effect of Organic Package Core Via Pitch Reduction on Power Distribution Performance", IEEE, 2004 Electronic Components and Technology Conference, pp. 1449-1453.

(Continued)

*Primary Examiner*—Leonardo Andújar
*Assistant Examiner*—Teresa M Arroyo
(74) *Attorney, Agent, or Firm*—Kim-Marie Vo; James L. Clingan, Jr.

(57) ABSTRACT

A structure includes a semiconductor die that has an arrangement of die pads on a surface of the semiconductor die. A first row of die pads consists of a first group of four die pads and run in a first direction. A second row of die pads are adjacent to the first row and consist of a second group of four die pads running in the first direction. The second row begins at a first offset in the first direction from where the first row begins. A third row of die pads are adjacent to the second row and comprise a third group of four die pads that run in the first direction. The third row begins at a second offset in the first direction from where the second row begins. This allows for relatively easy access to all of the die pads.

14 Claims, 3 Drawing Sheets

U.S. PATENT DOCUMENTS

| | | | | |
|---|---|---|---|---|
| 6,001,493 | A * | 12/1999 | Rutledge et al. | 428/620 |
| 6,107,109 | A * | 8/2000 | Akram et al. | 438/15 |
| 6,255,600 | B1 * | 7/2001 | Schaper | 174/255 |
| 6,594,811 | B2 * | 7/2003 | Katz | 716/12 |
| 6,650,014 | B2 * | 11/2003 | Kariyazaki | 257/737 |
| 6,834,427 | B2 * | 12/2004 | Cornelius et al. | 29/840 |
| 6,858,945 | B2 * | 2/2005 | Rakshani | 257/786 |
| 6,897,561 | B2 * | 5/2005 | Nemtsev et al. | 257/758 |
| 6,911,738 | B2 * | 6/2005 | Leinbach | 257/780 |
| 7,279,356 | B2 * | 10/2007 | Cornelius et al. | 438/106 |
| 2006/0017172 | A1 * | 1/2006 | Burton | 257/773 |
| 2006/0232301 | A1 * | 10/2006 | Morlion et al. | 326/126 |
| 2007/0090506 | A1 * | 4/2007 | Sundstrom | 257/686 |
| 2007/0130554 | A1 * | 6/2007 | Caruba | 716/11 |

OTHER PUBLICATIONS

Towle, et al., "Bumpless Build-Up Layer Packaging", Nov. 11, 2001, pp. 1-19.

\* cited by examiner

SEMICONDUCTOR DIE WITH DIE PAD PATTERN

BACKGROUND

1. Field

This disclosure relates generally to semiconductor die, and more specifically, to a semiconductor die structure with die pad patterns.

2. Related Art

Traditional semiconductor die pad arrays for example such as commonly found on die intended for flip-chip packages, utilize an undesirably large pad pitch which limits the number of pads that can be put on the die surface and utilize patterns which are inefficient for applications requiring a minimum number of layers for pad array escape routing. Pads which are patterned in conventional rectangular, checkerboard or closest-packed arrays are difficult to escape in a package requiring a minimum number of layers because typical package routing technology constraints prevent escape of more than two rows per routing layer and six or more rows are typically used. However, in traditional package substrates and in embedded chips package technologies using buildup-type layering, it would be desirable to be able to use at most only one or two routing layers for escape.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
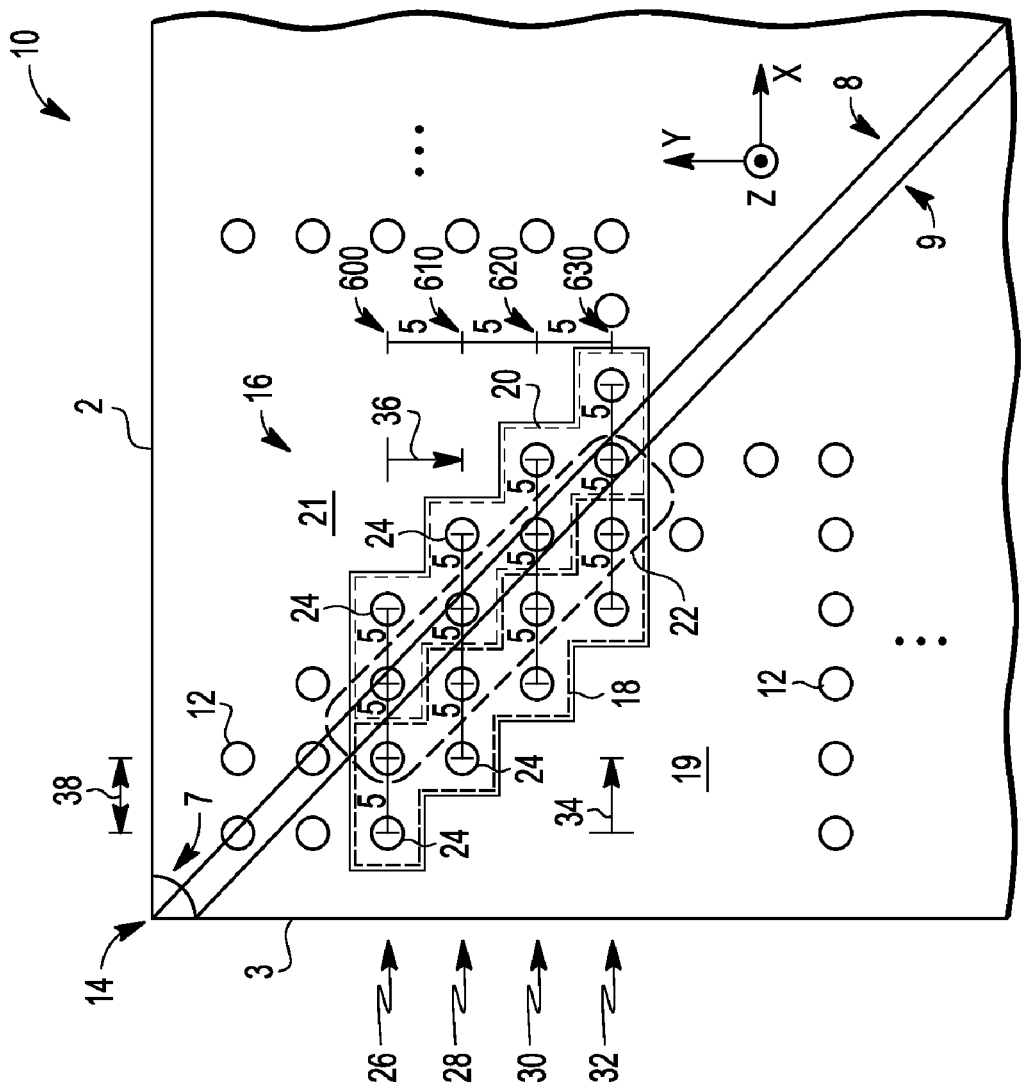
FIG. 1 is a top view of a portion of a semiconductor die featuring a die pad pattern according to one embodiment of the present disclosure.

FIG. 1 is a top view of a portion of a semiconductor die 10 featuring a die pad pattern according to one embodiment of the present disclosure. Semiconductor die 10 includes die pads 12 distributed about a surface of the semiconductor die 10. In particular, with respect to a corner 14 of semiconductor die 10, an arrangement of die pads 16 is provided. The arrangement of die pads 16 includes a first group of die pads 18 and a second group of die pads 20. Interior ones of the die pads of arrangement 16 include those die pads within the phantom line indicated by reference numeral 22. Exterior ones of the die pads of arrangement 16 are located outside of the interior ones, some of which are indicated by reference numeral 24.

In addition, die 10 comprises at least two regions or zones that do not contain any die pads (also referred to as unpopulated zones). One zone 19 is to the left and downward direction (negative x-direction and negative y-direction) of the first group of die pads 18 and one zone 21 is to the right and upward direction (positive x-direction and positive y-direction) of the second group of die pads 20. The unpopulated zones are of sufficient size to advantageously enable unobstructed escape routing of interior die pads 22 and exterior die pads 24 of arrangement 16, for both (i) fan-in of I/O pads (not shown) from the periphery of the die to the die pads and (ii) fan-out from the die pads to an overlying layer package output landing pads (e.g., BGA landing pads, or similar). Note that the signs of the x and y directions are stated in this example assuming an upper-left corner, whereas the same relative situation applies in any corner (upper-right, lower-left and lower-right) with appropriate flip or rotation of the coordinate system.

Arrangement 16 is further characterized by a number of rows of die pads, in which, adjacent rows are offset from one another by a given offset amount. For example, a first row of die pads 26 and a second row of die pads 28 are offset from one another by an offset amount 34 along the x-axis and by an offset amount 36 along the y-axis. An xyz coordinate reference is illustrated in FIG. 1 for clarity. In addition, the second row of die pads 28 and a third row of die pads 30 are offset from one another by an offset amount similar to amount 34 along the x-axis and by an offset amount similar to amount 36 along the y-axis. In addition, the third row of die pads 30 and a fourth row of die pads 32 are offset from one another by an offset amount similar to amount 34 along the x-axis and by an offset amount similar to amount 36 along the y-axis. In addition, the pitch between adjacent die pads 12 of an individual row of pads is illustrated by reference numeral 38.

In one embodiment, the arrangement of die pads comprises a first, second, and third row of die pads. The first row 26 of die pads consists of a first group of four die pads running in a first direction (for example, the x-direction). The second row 28 of die pads adjacent to the first row consists of a second group of four die pads running in the first direction, wherein the second row begins at a first offset 34 in the first direction from where the first row begins. The third row 30 of die pads adjacent to the second row 28 comprises a third group of four die pads running in the first direction, wherein the third row begins at a second offset in the first direction from where the second row begins. In one embodiment of the structure, the semiconductor die 10 has a corner 14 formed by a first side 2 and a second side 3, and the first, second, and third rows (26, 28, and 30, respectively) run parallel to the first side and orthogonal to the second side. In another embodiment, the structure further comprises a fourth row 32 of die pads adjacent to the third row of die pads. The fourth row 32 comprises a fourth group of four die pads running in the first direction, wherein the fourth row begins at a third offset in the first direction from where the third row begins. In a further embodiment, the fourth row also comprises an additional die pad.

In another embodiment, the structure further comprises a fifth row 4 of die pads comprising a group of two die pads, wherein the fifth row begins at a fourth offset in the first direction from where the fourth row begins. Still further, the structure includes wherein the die pads in the first, second, third, fourth, and fifth groups have their centers a first distance 5 apart. In such an instance, the first, second, third, and fourth offsets are equal to the first distance, and the first, second, third, fourth, and fifth rows have their centerlines 600, 610, 620, 630 the first distance apart.

In a further embodiment of the present disclosure, the beginning of the first row is less than twice the first distance from the second side of the semiconductor die and is less than four times the first distance from the first side of the semiconductor die. Still further, the structure includes wherein the third row is further characterized as consisting of the third group of die pads.

In yet another embodiment, a die having a top surface comprises a corner formed by at an intersection of a first side and a second side. A first group of four die pads on the top surface are aligned parallel to the first side and along a first centerline of the first group of four die pads. A second group of four die pads on the top surface are aligned parallel to the first side and along a second centerline of the second group of four die pads and spaced from the first centerline by a first amount, wherein the second group has a beginning that is offset from a beginning of the first group in a first direction. The structure further includes a third group of four die pads on the top surface aligned parallel to the first side and along a third centerline of the third group of four die pads and spaced from the second centerline by the first amount, wherein the third group has a beginning that is offset from the beginning of the second group in the first direction. The die further comprises a fourth group of die pads comprising four die pads on the top surface aligned parallel to the first side and along a fourth centerline spaced from the third centerline by the first amount, wherein the fourth group has a beginning that is offset from the beginning of the second group in the first direction. The fourth group further comprises an additional die pad on the top surface at an end of the fourth group.

In another embodiment, the die comprises wherein the first centerline is no more than four times the first amount from the first side. In addition, the beginning of the first group of four die pads is no more than twice the first amount from the second side.

In a further embodiment, the die also comprises a group of three die pads aligned parallel to the first side, along a fourth centerline of the group of three die pads, and between the first side and the first group of four die pads, wherein a beginning of the group of three die pads is aligned with the beginning of the first group of four die pads.

In a still further embodiment, the die comprises a group of two die pads aligned parallel to the first side, along a centerline of the group of two die pads, and between the first side and the group of three die pads, wherein a beginning of the group of two die pads is aligned with the beginning of the group of three die pads.

Figure 2:
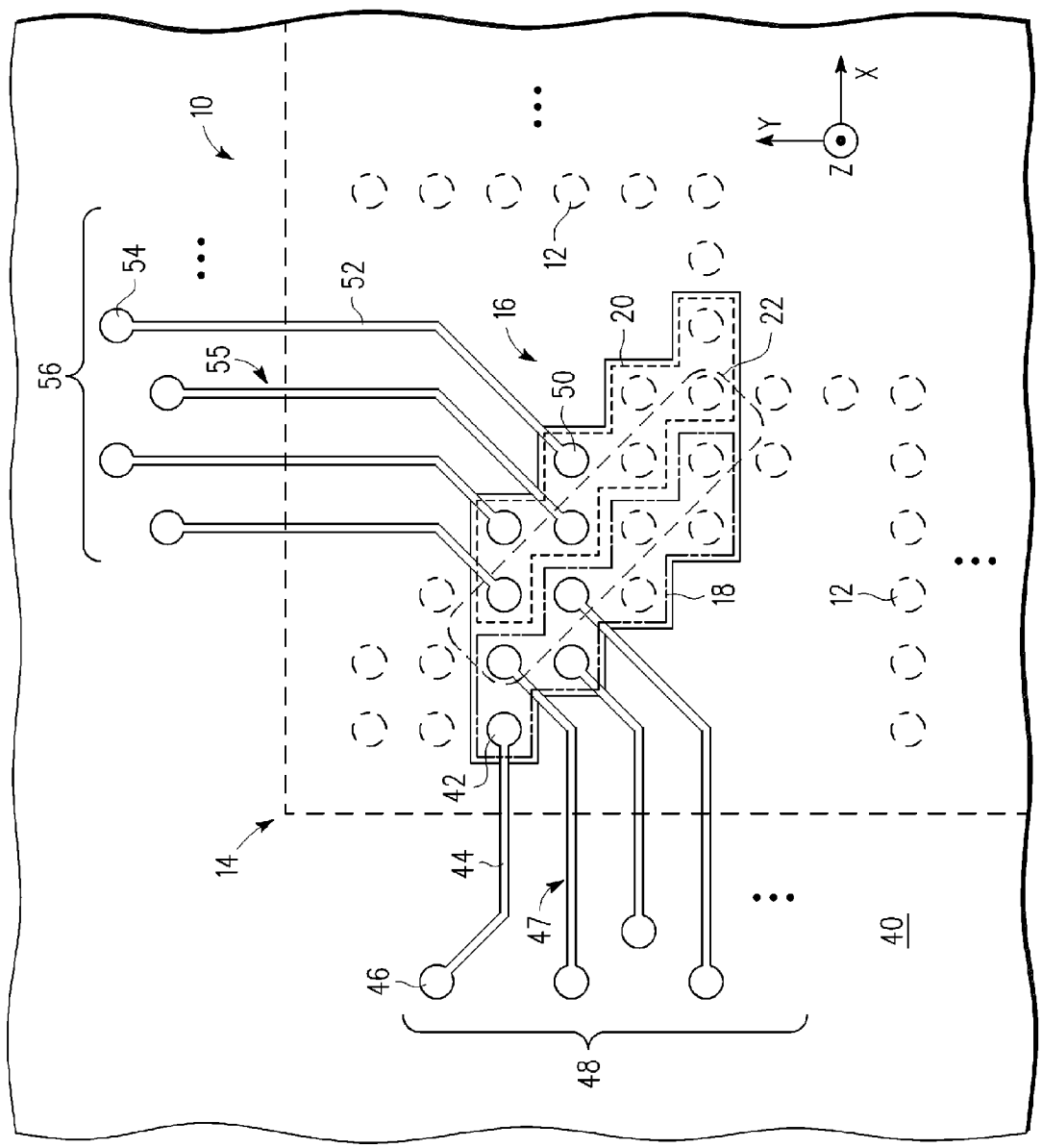
FIG. 2 is a top view of the portion of the semiconductor die featuring a die pad pattern of FIG. 1 with a first metallization layer of a package according to one embodiment of the present disclosure.

Referring again to the figures, FIG. 2 is a top view of the portion of the semiconductor die 10 featuring a die pad pattern of FIG. 1 with a first metallization layer of a package according to one embodiment of the present disclosure. The first metallization layer overlies the semiconductor die along the z-axis, and thus features underlying the first metallization layer are generally illustrated in phantom lines. In one embodiment, the first metallization layer includes a dielectric layer 40 with via openings (not shown) at corresponding locations of first metallization capture pads 42. A first plurality of traces 48 is provided for the first group 18 of die pads of the die pad arrangement 16. In particular, the first plurality of traces 48 includes captures pads 42, traces 44 and landing pads 46. Exterior pads 24 and interior pads 22 of the first group 18 of die pads of arrangement 16 escapes (i.e., fan out) from the die 10 via the plurality of traces 48. Furthermore, reference numeral 47 generally indicates a capture pad, trace, and landing pad routed to an interior pad 22 of the first group of pads 18 of arrangement 16. Respective ones of the plurality of traces 48 couple to interior pads 22 of the first group 18 of arrangement 16, wherein the corresponding trace of the interior pad escapes between two adjacent exterior pads 24, for example, of the first group 18. Additional traces (not shown) of the first plurality of traces 48 are generally represented by the dots " . . . " included within the bracket for 48 shown in FIG. 2.

Similarly, a second plurality of traces 56 is provided for the second group 20 of die pads of the die pad arrangement 16. In particular, the second plurality of traces 56 includes captures pads 50, traces 52 and landing pads 54. Exterior pads 24 and interior pads 22 of the second group 20 of die pads of arrangement 16 escapes (i.e., fan out) from the die via the plurality of traces 56. Furthermore, reference numeral 55 generally indicates a capture pad, trace, and landing pad routed to an interior pad 22 of the second group of pads 20 of arrangement 16. Respective ones of the plurality of traces 56 couple to interior pads 22 of the second group 20 of arrangement 16, wherein the corresponding trace of the interior pad escapes between two adjacent exterior pads 24, for example, of the second group 20. Additional traces (not shown) of the second plurality of traces 56 are generally represented by the dots " . . . " included within the bracket for 56 shown in FIG. 2.

Figure 3:
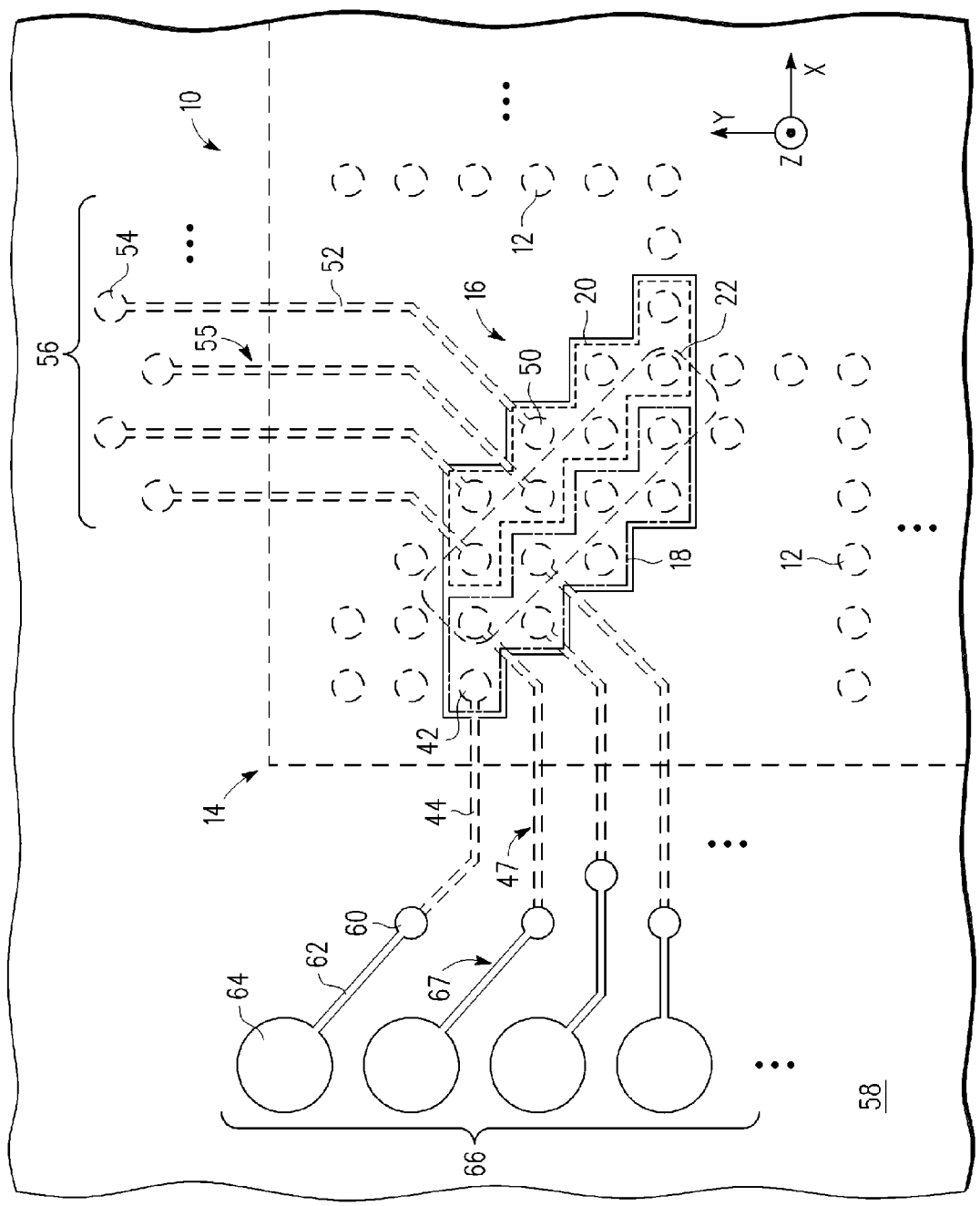
FIG. 3 is a top view of the portion of the semiconductor die featuring a die pad pattern with the first metallization layer of FIG. 2, further with a second metallization layer of the package according to one embodiment of the present disclosure.

FIG. 3 is a top view of the portion of the semiconductor die featuring a die pad pattern with the first metallization layer of FIG. 2, further with a second metallization layer of the package according to one embodiment of the present disclosure. The second metallization layer overlies the first metallization layer along the z-axis, and thus features underlying the second metallization layer are generally illustrated in phantom lines. In one embodiment, the second metallization layer overlies a dielectric layer 58 with via openings (not shown) at corresponding locations of second metallization capture pads 60. A first plurality of second metallization layer traces 66 is provided for continued routing of the plurality of first metallization layer traces 48. In particular, the first plurality of second metallization layer traces 66 includes captures pads 60, traces 62, and landing pads 64. Exterior pads 24 and interior pads 22 of the first group 18 of die pads of arrangement 16 escape (i.e., fan out) from the die 10 via the first plurality of first metallization layer traces 48 and via the first plurality of second metallization layer plurality traces 66. Furthermore, reference numeral 67 generally indicates a capture pad, trace, and landing pad routed via capture pad, trace, and landing pad of the first metallization layer (indicated by reference numeral 47) to an interior pad 22 of the first group of pads 18 of arrangement 16. Additional traces (not shown) of the first plurality of traces 66 are generally represented by the dots " . . . " included within the bracket for 66 shown in FIG. 3. In one embodiment, the second metallization landing pads 64 of the first and second plurality of second metallization traces comprise solder ball pads 64.

In a similar manner, a second plurality of second metallization layer traces (not shown, for simplicity of illustration) is provided for the second plurality of first metallization layer traces 56. The second plurality of second metallization layer traces is similar to the first plurality of second metallization layer traces. In particular, the second plurality of second metallization layer traces includes captures pads, traces, and landing pads. Exterior pads 24 and interior pads 22 of the second group 20 of die pads of arrangement 16 escape (i.e., fan out) from the die 10 via the second plurality of first metallization layer traces 56 and via the second plurality of second metallization layer plurality traces (not shown).

The embodiments of the present disclosure thus provide a new pad array pattern having routability and escapability properties which advantageously allow single layer or reduced layer count escape routing, which is especially beneficial for package technologies using a buildup-type technology. One key provision is a semi-regular pad array with a semi-regular pad pattern artwork having specifically optimized compatibility with high performance 65 µm and finer processes, embedded polygate or inline input/output (I/O) cell die designs, test probe technology and embedded-chip technologies such as the RCP (Redistributed Chip Package) technology. The embodiments also provide similar benefits within any technology having a layered routing scheme wherein it is desired to escape a large number of IO and utilize a minimal number of layers.

The embodiments of the present disclosure advantageously provide new die pad patterns uniquely adapted for high-yield embedded die processes that are tolerant of die and layer alignment limitations and routing layer buildup process limitations and allow use of as low a layer-count as possible to increase yields. In addition, the embodiments of the present disclosure advantageously provide for die floor-planning for 65 µm and finer processes and package I/O requirements to be simultaneously optimized within a low layer-count routing layer buildup technology. Furthermore, the embodiments advantageously provide a fine pitch solution for semiconductor die in both embedded-die applications as well as in fine-pitch flip-chip interconnect applications.

By now it should be appreciated that there has been provided a structure comprising a semiconductor die, wherein the semiconductor die includes an arrangement of die pads on a surface of the semiconductor die. The arrangement of die pads comprises a first, second, and third row of die pads. The first row of die pads consists of a first group of four die pads running in a first direction. The second row of die pads adjacent to the first row consists of a second group of four die pads running in the first direction, wherein the second row begins at a first offset in the first direction from where the first row begins. The third row of die pads adjacent to the second row comprises a third group of four die pads running in the first direction, wherein the third row begins at a second offset in the first direction from where the second row begins. In one embodiment of the structure, the semiconductor die has a corner formed by a first side and a second side, and the first, second, and third rows run parallel to the first side and orthogonal to the second side.

In another embodiment, the structure can further comprise a plurality of solder ball pads electrically connected to the first, second, and third group of die pads. In addition, the structure can still further comprise traces and vias for electrically connecting the first, second, and third group of die pads to the plurality of solder ball pads.

In still another embodiment, the structure further comprises a fourth row of die pads adjacent to the third row of die pads. The fourth row comprises a fourth group of four die pads running in the first direction, wherein the fourth row begins at a third offset in the first direction from where the third row begins. In a further embodiment, the fourth row also comprises an additional die pad.

In yet another embodiment, the structure further comprises a fifth row of die pads comprising a group of two die pads, wherein the fifth row begins at a fourth offset in the first direction from where the fourth row begins. Still further, the structure includes wherein the die pads in the first, second, third, fourth, and fifth groups have their centers a first distance apart. In such an instance, the first, second, third, and fourth offsets are equal to the first distance, and the first, second, third, fourth, and fifth rows have their centerlines the first distance apart.

In a further embodiment of the present disclosure, the beginning of the first row is less than twice the first distance from the second side of the semiconductor die and is less than four times the first distance from the first side of the semiconductor die. Still further, the structure includes wherein the third row is further characterized as consisting of the third group of die pads.

In another embodiment, a die having a top surface comprises a corner formed by at an intersection of a first side and a second side. A first group of four die pads on the top surface are aligned parallel to the first side and along a first centerline of the first group of four die pads. A second group of four die pads on the top surface are aligned parallel to the first side and along a second centerline of the second group of four die pads and spaced from the first centerline by a first amount, wherein the second group has a beginning that is offset from a beginning of the first group in a first direction. The structure further includes a third group of four die pads on the top surface aligned parallel to the first side and along a third centerline of the third group of four die pads and spaced from the second centerline by the first amount, wherein the third group has a beginning that is offset from the beginning of the second group in the first direction. The die further comprises a fourth group of die pads comprising four die pads on the top surface aligned parallel to the first side and along a fourth centerline spaced from the third centerline by the first amount, wherein the fourth group has a beginning that is offset from the beginning of the second group in the first direction. The fourth group further comprises an additional die pad on the top surface at an end of the fourth group.

In another embodiment, the die comprises wherein the first centerline is no more than four times the first amount from the first side. In addition, the beginning of the first group of four die pads is no more than twice the first amount from the second side.

In a further embodiment, the die also comprises a group of three die pads aligned parallel to the first side, along a fourth centerline of the group of three die pads, and between the first side and the first group of four die pads, wherein a beginning of the group of three die pads is aligned with the beginning of the first group of four die pads.

In a still further embodiment, the die comprises a group of two die pads aligned parallel to the first side, along a centerline of the group of two die pads, and between the first side and the group of three die pads, wherein a beginning of the group of two die pads is aligned with the beginning of the group of three die pads.

According to another embodiment of the present disclosure, a structure comprises: a semiconductor die including: a first group consisting of four die pads that form a first row on a top surface of the semiconductor die; a second group consisting of four die pads that are different from the four die pads of the first group and that form a second row adjacent to the first row and parallel to the first row, wherein the second row begins at a first offset in a first direction from where the first row begins; and a third group consisting of four die pads that are different from the four die pads of the first and the four die pads of the second group and that form a third row adjacent to the second row and parallel to the second row, wherein the third row begins at a second offset in the first direction from where the second row begins. The structure further comprises: a fourth group comprising four die pads that are different from the four die pads of the first group, the four die pads of the second group, and the four die pads of the third group and that form a fourth row adjacent to the second row and parallel to the second row, wherein the third row begins at a second offset in the first direction from where the second row begins. Furthermore, the semiconductor die has a corner having an angle 7, and the first, second, third, and fourth groups form an arrangement having symmetry about a line 9 that is parallel with a line 8 that bisects the angle of the corner.

Because the apparatus implementing the present invention is, for the most part, composed of components known to those skilled in the art, details thereof will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A structure, comprising:
    a semiconductor die, wherein the semiconductor die includes an arrangement of die pads on a surface of the semiconductor die comprising;
        a first row of die pads consisting of a first group of four die pads running in a first direction;
        a second row of die pads adjacent to the first row consisting of a second group of four die pads running in the first direction, wherein the second row begins at a first offset in the first direction from where the first row begins;
        a third row of die pads adjacent to the second row comprising a third group of four die pads running in the first direction, wherein the third row begins at a second offset in the first direction from where the second row begins; and
        a fourth row of die pads adjacent to the third row of die pads comprising a fourth group of four die pads running in the first direction, wherein the fourth row begins at a third offset in the first direction from where the third row begins and the fourth row further comprises an additional die pad;
        a fifth row of die pads comprising a group of two die pads, wherein the fifth row begins at a fourth offset in the first direction from where the fourth row begins, wherein:
            the die pads in the first, second, third, fourth, and fifth groups have their centers a first distance apart;
            the first, second, third, and fourth offsets are equal to the first distance; and
            the first, second, third, fourth, and fifth rows have centerlines, wherein the centerlines are the first distance apart.

2. The structure of a claim 1, wherein:
    the semiconductor die has a corner formed by a first side and a second side; and
    the first, second, and third rows run parallel to the first side and orthogonal to the second side.

3. The structure of claim 1, wherein the first row is less than twice the first distance from the second side of the semiconductor die and is less than four times the first distance from the first side of the semiconductor die.

4. The structure of claim 3, wherein the third row is further characterized as consisting of the third group of die pads.

5. The structure of claim 1 further comprising a plurality of solder ball pads electrically connected to the first, second, and third group of die pads.

6. The structure of claim 5, further comprising traces and vias for electrically connecting the first, second, and third group of die pads to the plurality of solder ball pads.

7. A die having a top surface, comprising:
    a corner formed at an intersection of a first side and a second side;
    a first group of four die pads on the top surface aligned parallel to the first side and along a first centerline of the first group of four die pads;
    a second group of four die pads on the top surface aligned parallel to the first side and along a second centerline of the second group of four die pads and spaced from the first centerline by a first amount, wherein the second group has a beginning that is offset from a beginning of the first group in a first direction, and no die pads are present between the beginning of the second group and the second side; and
    a third group of four die pads on the top surface aligned parallel to the first side and along a third centerline of the third group of four die pads and spaced from the second centerline by the first amount, wherein the third group has a beginning that is offset from the beginning of the second group in the first direction, and no die pads are present between the beginning of the third group and the second side.

8. The die of claim 7, further comprising:
    a fourth group of die pads comprising four die pads on the top surface aligned parallel to the first side and along a fourth centerline spaced from the third centerline by the first amount, wherein the fourth group has a beginning that is offset from the beginning of the second group in the first direction.

9. The die of claim 8, wherein the fourth group further comprises an additional die pad on the top surface at an end of the fourth group.

10. The die of claim 7, wherein the first centerline is no more than four times the first amount from the first side.

11. The die of claim 10, wherein the beginning of the first group of four die pads is no more than twice the first amount from the second side.

12. The die of claim 7, comprising a group of three die pads aligned parallel to the first side, along a fourth centerline of the group of three die pads, and between the first side and the first group of four die pads, wherein a beginning of the group of three die pads is aligned with the beginning of the first group of four die pads.

13. The die of claim 12, comprising a group of two die pads aligned parallel to the first side, along a centerline of the group of two die pads, and between the first side and the group of three die pads, wherein a beginning of the group of two die pads is aligned with the beginning of the group of three die pads.

14. A structure, comprising:
a semiconductor die including:
a first group consisting of four die pads that form a first row on a top surface of the semiconductor die;
a second group consisting of four die pads that are different from the four die pads of the first group and that form a second row adjacent to the first row and parallel to the first row, wherein the second row begins at a first offset in a first direction from where the first row begins;
a third group consisting of four die pads that are different from the four die pads of the first group and the four die pads of the second group and that form a third row adjacent to the second row and parallel to the second row, wherein the third row begins at a second offset in the first direction from where the second row begins; and
a fourth group comprising four die pads that are different from the four die pads of the first group, the four die pads of the second group, and the four die pads of the third group and that form a fourth row adjacent to the third row and parallel to the third row, wherein the fourth row begins at a third offset in the first direction from where the third row begins, wherein:
the semiconductor die has a corner having an angle; and
the first, second, third, and fourth groups form an arrangement having symmetry about a line that is parallel with a line that bisects the angle of the corner.

* * * * *